(12) United States Patent
Nicholls et al.

(10) Patent No.: US 8,674,778 B2
(45) Date of Patent: Mar. 18, 2014

(54) METHOD AND SYSTEM FOR CORRECTING OSCILLATOR FREQUENCY DRIFT

(75) Inventors: Charles W. T. Nicholls, Nepean (CA); Philippe Wu, Kanata (CA)

(73) Assignee: Apple Inc., Cupertino, CA (US)

( * ) Notice: Subject to any disclaimer, the term of this patent is extended or adjusted under 35 U.S.C. 154(b) by 851 days.

(21) Appl. No.: 12/118,134

(22) Filed: May 9, 2008

(65) Prior Publication Data

US 2009/0278616 A1 Nov. 12, 2009

(51) Int. Cl.
*H03B 5/32* (2006.01)
*H03L 1/00* (2006.01)

(52) U.S. Cl.
USPC .......................... 331/176; 331/158

(58) Field of Classification Search
USPC .............................. 331/65, 66, 176
See application file for complete search history.

(56) References Cited

U.S. PATENT DOCUMENTS 4,899,117 A * 2/1990 Vig ................................ 331/3
7,015,762 B1 * 3/2006 Nicholls et al. ............... 331/10

* cited by examiner

*Primary Examiner* — Levi Gannon
(74) *Attorney, Agent, or Firm* — Meyertons, Hood, Kivlin, Kowert & Goetzel, P.C.

(57) ABSTRACT

A method and apparatus for correcting oscillator frequency drift due to crystal aging. Correction signals that reflect a difference between an oscillator timing signal and a reference timing signal over a reference timing signal interval are modeled so that auxiliary correction signals can be generated in the event of loss of the reference timing signal. A temperature curve is generated to model how temperature variation impacts oscillator frequency drift. A rate of frequency drift due to crystal aging is also determined. During loss of a reference timing signal, auxiliary correction signals can be generated to maintain the oscillator at a desired frequency until the reference timing signal becomes available again.

18 Claims, 5 Drawing Sheets

METHOD AND SYSTEM FOR CORRECTING OSCILLATOR FREQUENCY DRIFT

FIELD OF THE INVENTION

This invention generally relates to oscillators, and in particular relates to correcting oscillator frequency drift caused by temperature variation and crystal aging.

BACKGROUND OF THE INVENTION

An oscillator provides a timing signal which is used by a telecommunications base station for communications. In certain telecommunications systems it is important that the timing signal provided by a base station is synchronized with timing signals in other base stations. A Global Positioning System (GPS) reference timing signal can be derived from GPS signals that are received by a GPS receiver in the base station to provide a uniform reference timing signal to which oscillators in base stations can be locked, enabling base stations to synchronize with one another.

An oscillator in a base station is responsive to a drive signal. Because the oscillator may drift over temperature and time, the drive signal must be corrected periodically to keep the oscillator locked to the GPS reference timing signal. During normal operation when the GPS reference timing signal is available, a primary correction signal is used to correct the drive signal. However, when the GPS signals are unavailable due to equipment failures or environmental conditions, for example, an auxiliary correction signal must be provided in place of the primary correction signal until the GPS signal becomes available again. This is sometimes referred to as a holdover period. If the auxiliary correction signal is inaccurate during the holdover period, the base station will lose synchronization with the other base stations. Unfortunately, generating accurate auxiliary correction signals has proven to be difficult, expensive, or both. As such, there is a need for an effective and efficient technique for generating accurate auxiliary correction signals when the GPS signals are unavailable.

SUMMARY OF THE INVENTION

According to one embodiment of the present invention, a correction signal that reflects a difference between an oscillator timing signal and a reference timing signal over a reference timing signal interval is modeled so that an auxiliary correction signal can be generated in the event of loss of the reference timing signal. The auxiliary correction signal can be used to modify an oscillator drive signal to maintain an oscillator at a desired frequency. A correction signal includes components that compensate for frequency drift due to temperature variation, crystal aging, and electronic noise. Correction signals and corresponding temperatures are obtained for each reference timing signal interval for a first time period. After sufficient collection of correction signals over the first time period and a range of temperatures, a correction signal temperature curve is generated that models how oscillator frequency drifts as a function of temperature variation.

Subsequent correction signals and corresponding temperatures are obtained over a second time period. Temperature model corrected signals are generated as a function of the subsequent correction signals and the temperature model, and residual correction signals are generated. A residual correction signal contains components that compensate for random noise from electronics and frequency drift due to crystal aging. Residual correction signals are integrated over the second time period to separate the crystal aging component from the electronic noise component, and an aging drift rate is determined. The aging drift rate reflects the rate of frequency drift due to crystal aging over each reference timing signal interval. According to one embodiment of the present invention, if a cumulative value of the integrated residual correction signals over the second time period is below a predetermined threshold, the aging drift rate can be set to zero.

An aging curve generated as a function of the residual correction signals and GPS clock values can be used to compute an initial starting point for an auxiliary correction signal at the start of a holdover period.

Upon loss of the GPS signal, the auxiliary correction signals are generated using the correction signal temperature curve, the aging drift rate, and the aging curve, and are used to modify an oscillator drive signal to maintain an oscillator at a desired frequency during the holdover period.

Those skilled in the art will appreciate the scope of the present invention and realize additional aspects thereof after reading the following detailed description of the preferred embodiments in association with the accompanying drawing figures.

BRIEF DESCRIPTION OF THE DRAWINGS

The accompanying drawings incorporated in and forming a part of this specification illustrate several aspects of the invention, and together with the description serve to explain the principles of the invention. In the drawings.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

Figure 1:
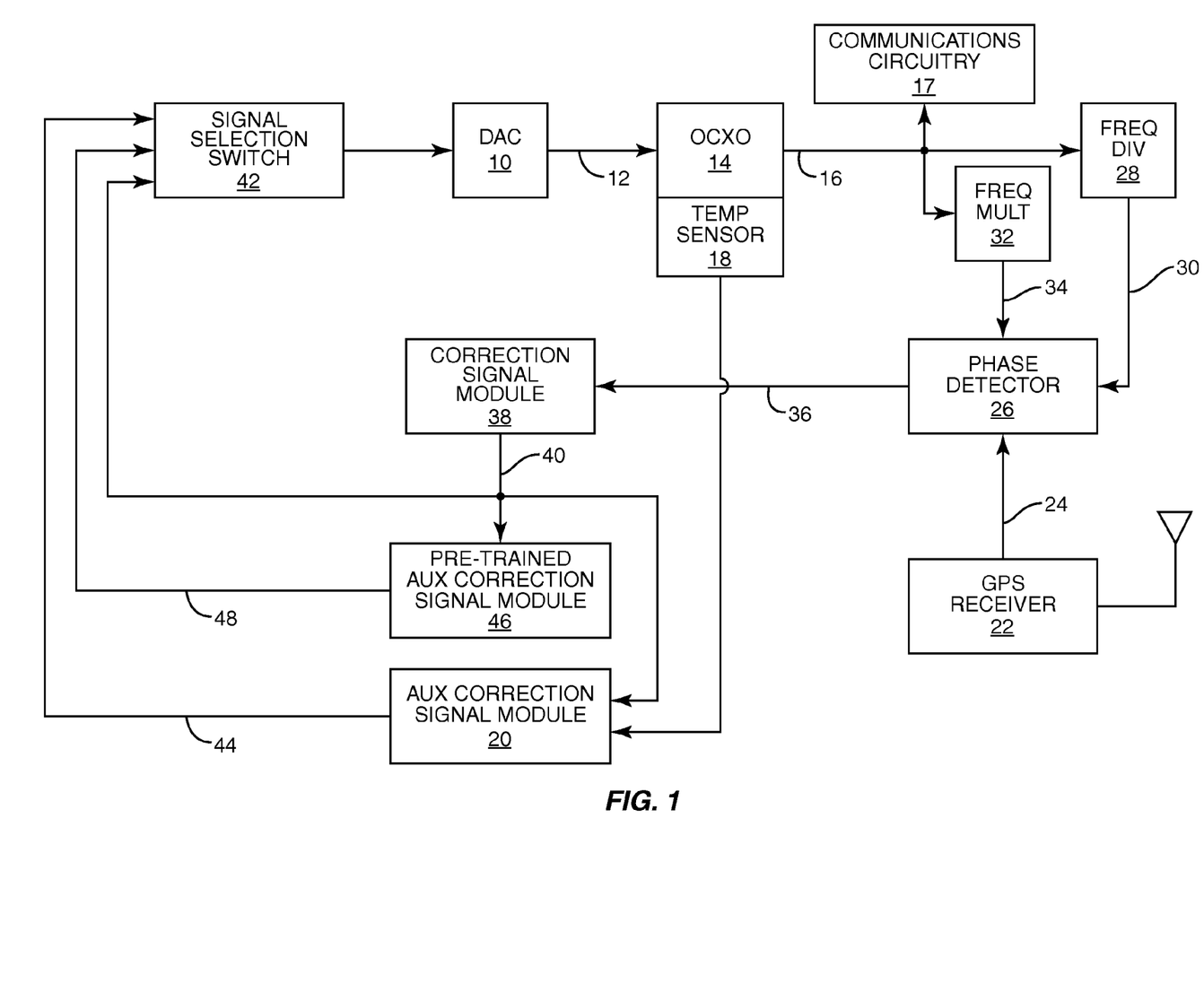
FIG. 1 is a block diagram illustrating an exemplary timing circuit in which the present invention can be utilized.

Referring now to the drawings, FIG. 1 is a block diagram showing an exemplary timing circuit in which the present invention can be utilized. While the present invention is described in the context of a wireless telecommunications base station, it will be apparent to those skilled in the art that the present invention is applicable to any application that benefits from oscillator frequency drift correction when a reference timing signal is temporarily unavailable.

A digital-to-analog converter (DAC) 10 provides a drive signal 12 to an oscillator 14 to cause the oscillator 14 to generate a base station timing signal 16 at a desired frequency for use by base station communications circuitry 17 in wireless communications. The drive signal 12 may be, for example, at a particular voltage level for a voltage-controlled oscillator, or may comprise a particular current for a current-controlled oscillator. According to one embodiment of the present invention, the oscillator 14 comprises a crystal oscillator, and in particular an oven controlled crystal oscillator (OCXO), but it should be apparent to those skilled in the art that the oscillator 14 can comprise any type of oscillator that is locked to a reference timing signal that can be periodically unavailable. The oscillator 14 includes a temperature sensor 18, which can provide a temperature associated with the oscillator 14 to an auxiliary correction signal module 20, as described in greater detail below.

The base station timing signal 16 is preferably synchronized with other base station timing signals generated in other base stations. One mechanism that can enable such synchronization across multiple base stations is the Global Positioning System (GPS). Accordingly, when a GPS signal is available, a GPS receiver 22 receives GPS signals from GPS. The GPS receiver 22 generates a GPS reference timing signal 24 at a reference timing interval and provides the GPS reference timing signal 24 to a phase detector 26. According to one embodiment of the present invention, the reference timing interval is a one second interval, and thus the GPS reference timing signal 24 is sent to the phase detector 26 every second. While the GPS signals are highly accurate, the GPS receiver 22 contains electronics that introduce random noise into the GPS reference timing signal 24. For example, the random noise introduced by the GPS electronics can be 20 nanoseconds (ns) per second, which correlates to a frequency drift of 20 parts per billion (ppb) per second.

The oscillator 14 also provides the base station timing signal 16 to a frequency divider 28, which divides the base station timing signal 16 by a predetermined divisor to generate an oscillator comparison signal 30 every reference timing interval, in this example every second. The oscillator 14 also provides the base station timing signal 16 to a frequency multiplier 32, which multiplies the frequency of the base station timing signal 16 by a predetermined multiplication factor, such as 16, and provides a counter signal 34 to the phase detector 26 at a frequency that is the product of the frequency of the base station timing signal 16 and the predetermined multiplication factor. For example, if the base station timing signal 16 is a 10 megahertz (MHz) signal, and the predetermined multiplication factor is 16, then the frequency multiplier 32 provides a 160 MHz signal to the phase detector 26.

The phase detector 26 receives the GPS reference timing signal 24 and the oscillator comparison signal 30 and determines a phase difference between the two signals 24 and 30 as a function of the counter signal 34. One mechanism for using a counter signal and determining a difference in phase between a local timing signal and a reference timing signal is disclosed in U.S. Pat. No. 7,015,762 B2, which is hereby incorporated by reference herein, although any mechanism known to those skilled in the art suitable for quantifying the difference between a local timing signal and a reference timing signal could be utilized in the present invention.

A difference signal 36 quantifying a phase difference between the oscillator comparison signal 30 and the GPS reference timing signal 24 is provided to a correction signal module 38, which generates a primary correction signal 40 as a function of the difference signal 36. A phase difference may exist between the GPS reference timing signal 24 and the oscillator comparison signal 30 due to a number of factors, including frequency drift of the oscillator 14 due to temperature variation, frequency drift of the oscillator 14 due to crystal aging, and variations in the GPS reference timing signal 24 due to electronic noise generated by the GPS receiver 22. The generation of a primary correction signal suitable for use in the present invention is described in detail in U.S. Pat. No. 7,015,762 B2, and will not be described in detail herein, except to note that such a primary correction signal can comprise the difference between the phase of the GPS reference timing signal 24 and the phase of the oscillator comparison signal 30 in units of time, such as in nanoseconds (ns).

The primary correction signal 40 is provided to a signal selection switch 42. The signal selection switch 42 is a switch that provides a correction signal to the DAC 10 from one of three sources depending on the status of various indicators, or flags. During normal operation, a GPS lock flag (not shown) will be set indicating that a GPS signal is available to the GPS receiver 22. The signal selection switch 42 will determine if the GPS lock flag is set and, if so, will provide the primary correction signal 40 to the DAC 10 to modify the drive signal 12 in a manner that compensates for the frequency difference reflected in the difference signal 36. In this manner, during normal operation, the oscillator 14 is locked to the GPS reference timing signal 24, and is therefore in synchronization with other oscillators locked to GPS signals.

From time to time, due to environmental conditions or equipment failure for example, a GPS signal can not be acquired. This is sometimes referred to as a holdover period. As will be apparent to those skilled in the art, if a correction signal cannot be supplied during such a holdover period to correct for frequency drift due to temperature variation and crystal aging, the oscillator 14 would eventually deviate from GPS signals to such an extent that the base station would lose synchronization with other base stations. However, without the GPS reference timing signal 24, it can be difficult or impossible to provide a correction signal that will keep the oscillator 14 accurate to such an extent that it does not lose synchronization with oscillators in other base stations. In order to provide an accurate auxiliary correction signal, the frequency drift caused by temperature variation and the frequency drift caused by crystal aging must be determined. However, a primary difficulty in determining frequency drift of the oscillator 14 due to crystal aging is that such frequency drift is several magnitudes smaller than the second-by-second frequency jitter of the GPS reference timing signal 24 due to electronic noise generated by the GPS receiver 22. For example, frequency jitter due to electronic noise in the GPS receiver 22 can be as much as 20 ns per second, or 20 ppb per second. In comparison, frequency drift due to crystal aging may be less than 1 ppb per day. Consequently, it can be extremely difficult to determine the extent to which the oscillator 14 drifts due to crystal aging because the frequency drift attributable to crystal aging is extremely small with respect to the random frequency drift attributable to the electronic noise from the GPS receiver 22. Preferably, the frequency drift due to crystal aging should be determined as quickly as possible so that the apparatus providing the timing signal, in this example a telecommunications base station, is prepared to maintain operations as soon as possible in the event of a loss of the GPS signal. The present invention, as discussed in greater detail herein, provides a method and apparatus for determining and quantifying the relatively small frequency drift due to crystal aging in a relatively short time frame despite being hidden in a relatively large quantity of electronic noise. The present invention enables equipment, such as a telecommunications base station, to use lower cost crystal oscillators in lieu of more expensive frequency generators, such as Cesium or Rubidium-based clocks, and the present invention enables a base station using such an oscillator to be able to provide accurate timing in the event of a holdover period in a relatively short time frame.

According to one embodiment of the present invention, as described in greater detail with reference to FIGS. 2-5 below, during a holdover period and after completion of a temperature model training process and an age model training process, the auxiliary correction signal module 20 provides an auxiliary correction signal 44 to the signal selection switch 42. The signal selection switch 42 will determine that the GPS lock flag is reset, indicating that the GPS signal is not acquired, that a training status flag (not shown) is reset, indicating that the training period has completed, and select the auxiliary correction signal 44 for providing to the DAC 10. Similarly, as described previously with respect to the primary correction signal 40, the DAC 10 will modify the drive signal 12 in accordance with the auxiliary correction signal 44.

During a holdover period and prior to completion of the training period as described below, a pre-trained auxiliary correction signal module 46 can provide a pre-trained auxiliary correction signal 48 to the signal selection switch 42. While the pre-trained auxiliary correction signal 48 will not be as accurate as an auxiliary correction signal 44, it may keep the oscillator 14 in synchronization with other oscillators synchronized to a GPS signal for a limited period of time, during which time the GPS signal may be able to be reacquired. The signal selection switch 42 will determine that the GPS lock flag is reset, indicating that the GPS signal is not acquired, that the training status flag is set, indicating that training has not yet completed, and therefore provide the pre-trained auxiliary correction signal 48 to the DAC 10 for modifying the drive signal 12. A pre-trained auxiliary correction signal 48 can be generated as described in U.S. Pat. No. 7,015,762 B2, and will not be discussed in detail herein.

Figure 2:
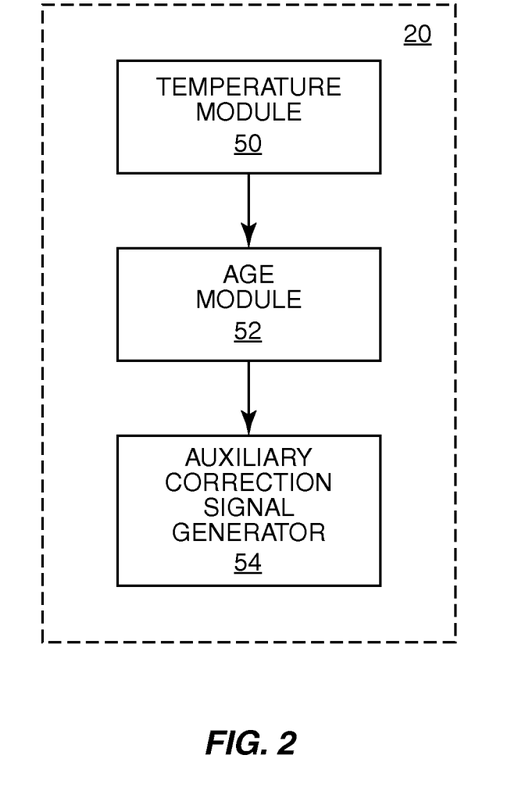
FIG. 2 is a diagram illustrating three modules according to one embodiment of the present invention.

FIG. 2 is a diagram illustrating three modules associated with the auxiliary correction signal module 20, according to one embodiment of the present invention. During a temperature model training process, a temperature module 50 obtains primary correction signals and corresponding temperatures over a first time period sufficient to determine a correction signal temperature curve that models the manner in which temperature variation impacts frequency drift of the oscillator 14 (FIG. 1). After the temperature model training process concludes, an age model training process begins. An age module 52 obtains subsequent correction signals and corresponding temperature values over a second time period. Temperature model corrected values are generated as a function of the subsequent correction signals and the correction signal temperature curve, and residual correction signals are generated. Each residual correction signal contains a component that compensates for random noise from electronics of the GPS receiver 22 and a component that compensates for frequency drift due to crystal aging. Residual correction signals are integrated over the second time period such that the component that compensates for frequency drift due to crystal aging rises above the level of the random noise and can be identified in a relatively short time frame, and an aging drift rate is determined. The aging drift rate reflects the rate of frequency drift due to crystal aging over each reference timing signal interval. The age model 52 also generates an aging curve as a function of the residual correction signals and GPS clock values that can be used to determine an initial starting point for an auxiliary correction signal 44 at the start of a holdover period. The GPS clock may be a counter that is incremented at a rate determined by the reference signal timing interval.

Assuming completion of both the temperature model training process and the age model training process, then, upon loss of the GPS signal, an auxiliary correction signal generator 54 can generate auxiliary correction signals using the correction signal temperature curve, the aging drift rate, and the aging curve. As discussed previously, auxiliary correction signals 44 can be used to modify the oscillator drive signal 12 to maintain the oscillator 14 at the appropriate frequency during the holdover period such that the base station remains synchronized with other base stations.

Figure 3:
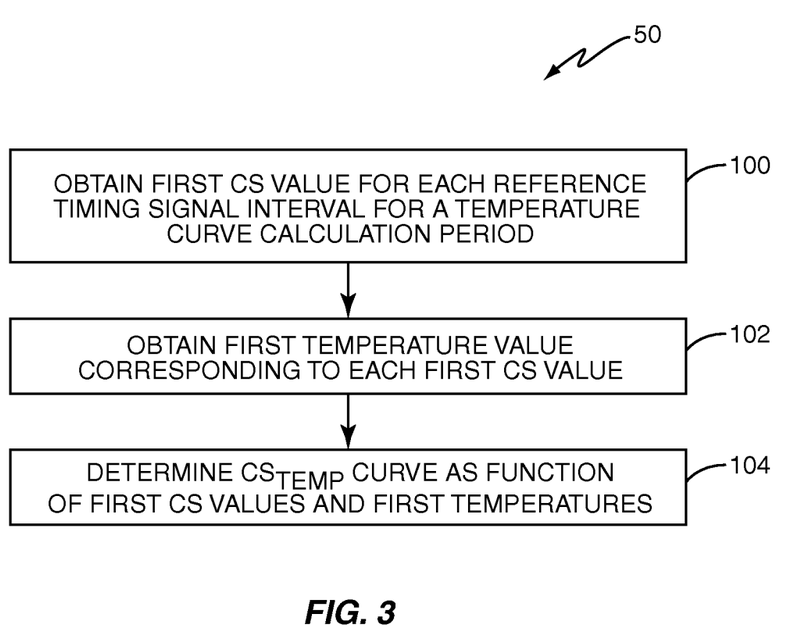
FIG. 3 is a flow diagram illustrating steps associated with the temperature module shown in FIG. 2, according to one embodiment of the present invention.

Referring now to FIG. 3, the temperature module 50 of FIG. 2 suitable for carrying out the temperature model training process will be described in greater detail. During startup of the base station under normal operating conditions, a GPS signal is acquired and the GPS lock flag is set, indicating reception of a GPS signal. A training status flag is also set, indicating that the auxiliary correction signal module 20 is in a training mode and not able to provide an auxiliary correction signal 44. The temperature module 50 obtains correction signals generated each reference timing signal interval as described previously with reference to FIG. 1 (step 100), and obtains a temperature from the temperature sensor 18 (FIG. 1) corresponding to each correction signal (step 102). Correction signals and corresponding temperatures are obtained over a temperature curve calculation period, and for each reference timing signal interval and a range of different temperatures, until the first time period has elapsed and a sufficient range of temperatures has been obtained. The temperature curve calculation period is sometimes referred to herein as the first time period. A correction signal temperature curve is generated that models how temperature variation impacts correction signals based on the obtained correction signals and corresponding temperatures (step 104). According to one embodiment of the present invention, the first time period comprises a four hour period, and a sufficient range of temperature values is eight, but it should be apparent to those skilled in the art that fewer or more temperature values may be appropriate depending on the accuracy required and the conditions under which the oscillator 14 operates. Assuming a temperature sensor capable of distinguishing 0.5 degree variations in temperature, for example, a range of temperatures from 60° to 63° Celsius may be sufficient to generate eight different temperature values. The correction signal temperature curve can be generated using any conventional method for fitting a curve to data, including regression analyses, such as a least squares method. The correction signal temperature curve ($CS_{TEMP}$) can be in the form of a linear equation, such as:

$$\text{correction\_signal} = m \cdot \text{Temperature} + c,$$

wherein m is the slope of the line, Temperature is the temperature associated with the oscillator, and c is the y-intercept.

Upon completion of temperature model training, the coefficients of the correction signal temperature curve, m (slope), and c (y-intercept) are stored in a memory, such as an EEPROM, for use by the age module 52 and the auxiliary correction signal generator 54, as discussed in greater detail below. According to one embodiment of the present invention, even after completion of temperature model training, the temperature module 50 continues to obtain correction signals and corresponding temperatures, and periodically updates the correction signal temperature curve coefficients m and c based on such correction signals and corresponding temperatures. According to another embodiment of the present invention, the correction signal temperature curve coefficients m and c are calculated and updated each reference timing signal interval. According to yet another embodiment of the present invention, memory buffers that are used to store the correction signals and corresponding temperatures are cleared after a period of time, for example 24 hours, and the process as described above with respect to the analysis of correction signals and corresponding temperatures is repeated. However, even during such time period, the age model 52, as described below, can continue to train using the most recently computed m and c coefficients.

Figure 4:
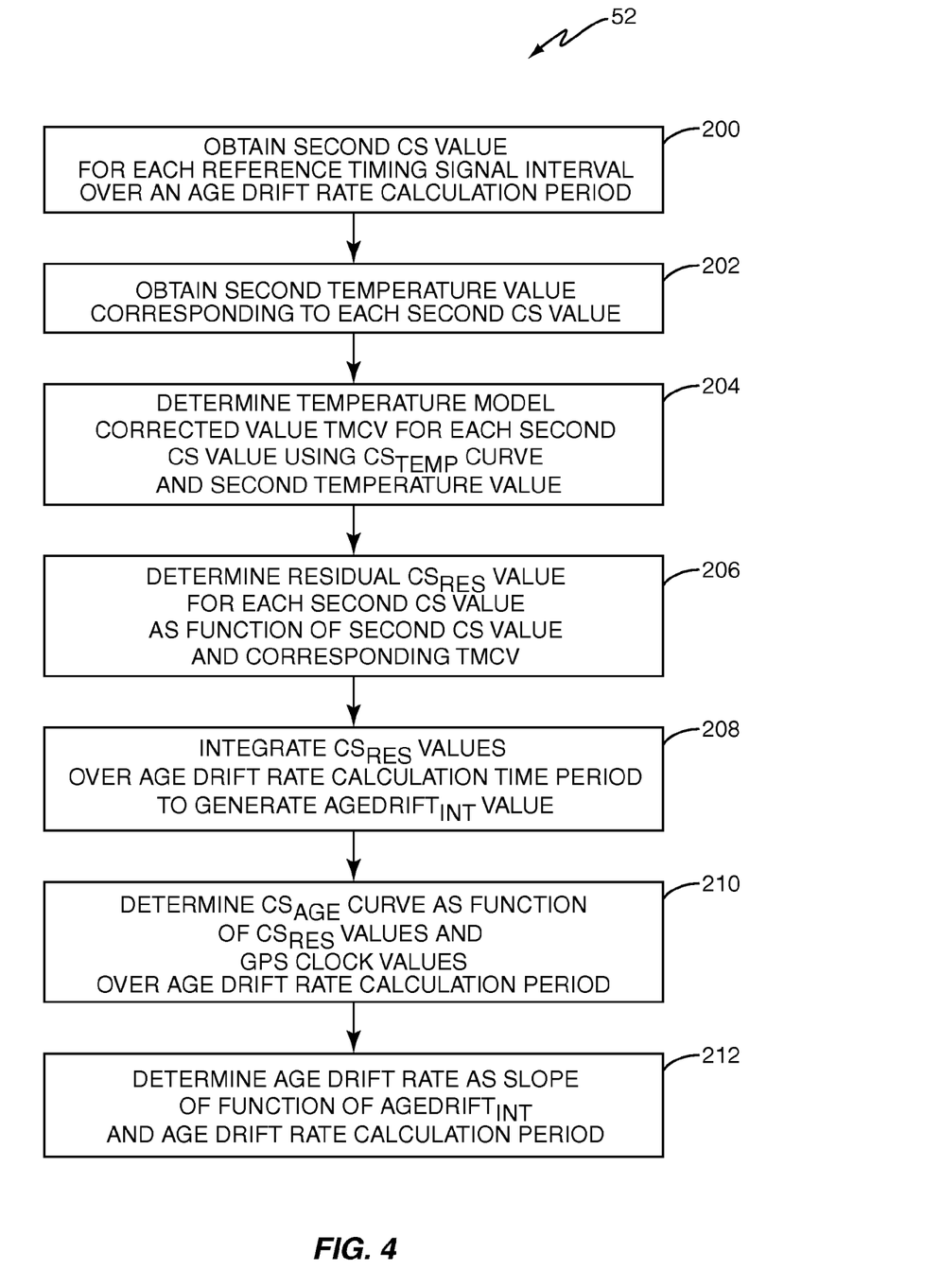
FIG. 4 is a flow diagram illustrating steps associated with the age module shown in FIG. 2, according to one embodiment of the present invention.

Upon completion of temperature model training, the age model training process can begin. Referring now to FIG. 4, an age module 52 suitable for carrying out the age model training process according to one embodiment of the invention is shown in greater detail. Correction signals generated by the correction signal module 38 as described previously are obtained over an age drift rate calculation period, sometimes referred to herein as a second time period (step 200). Temperature values corresponding to the correction signals are then obtained (step 202). A temperature model corrected value (TMCV) is then generated as a function of each correction signal and its corresponding temperature value (step 204). The TMCV can be generated using the m and c coefficients stored by the temperature module 50 in accordance with the following equation:

TMCV=$m$·Temperature+$c$.

A correction signal residual value $CS_{res}$ can then be calculated (step 206) using the TMCV in the following manner:

$CS_{res}$=correction_signal−TMCV.

$CS_{res}$ thus contains a value that reflects the obtained correction signal minus the component that compensates for frequency drift due to temperature variation, in accordance with the correction signal temperature curve $CS_{TEMP}$. Thus, $CS_{res}$ contains those components that compensate for frequency drift due to crystal aging and electronic noise, respectively. $CS_{res}$ values and corresponding GPS clock values are stored in a buffer for use later in generating an age curve, as described in detail below. $CS_{res}$ values are integrated over the second time period (step 208), using the following equation:

AGEDRIFT$_{int}$=AGEDRIFT$_{int}$+($CS_{res}$·reference timing signal interval), wherein AGEDRIFT$_{int}$ is initially zero and is accumulated for each reference timing signal interval.

Where the reference timing signal interval equals one second, this can be simplified to:

AGEDRIFT$_{int}$=AGEDRIFT$_{int}$+$CS_{res}$.

Assuming that the frequency drift caused by crystal aging is effectively linear over a relatively short period of time, such as one day, then the integral of the $CS_{res}$ component that compensates for frequency drift due to crystal aging will grow as a square of the time over which it is integrated. Because the jitter due to electronic noise is random, it tends to average out to a zero or near zero value over the integration period, and the integral of the component that compensates for frequency drift due to crystal aging will rise to a detectable level above that of the random noise. According to one embodiment of the present invention, the second time period comprises six hours.

After completion of the second time period, a curve is fit to the $CS_{res}$ values as a function of the GPS clock values (step 210). Any method known to those skilled in the art suitable to fit a curve to data is suitable. According to one embodiment of the present invention, a least squares fit analysis is used to generate a linear equation of the following form:

$CS_{res}$=$ma$·GPS clock+$ca$, wherein ma is the slope of the curve, ca is the y-intercept, and GPS clock is a counter that is incremented at a rate determined by the reference signal timing interval. The ma and ca variables are stored in a memory, such as an EEPROM, for use during a holdover period, as described below in reference to the auxiliary correction signal generator 54 for calculating an initial starting value for an auxiliary correction signal. An aging drift rate (ADR) reflecting the effect of crystal aging on frequency drift in terms of nanoseconds/second is computed (step 212) in the following manner. First, recognizing that the $CS_{res}$ signals contain a component to compensate for frequency drift due to crystal aging and a component to compensate for frequency drift due to electronic noise in units of nanoseconds, and assuming that the effect of drift due to crystal aging follows a linear time dependence over a relatively short time period, such as one day, then:

$$\frac{df}{dt} = ADR \cdot t + ca,$$

wherein $$\frac{df}{dt}$$

is the rate of change of fractional frequency stability, where fractional frequency stability is given by:

$$f = \frac{[F(t) - f_0]}{f_0},$$

wherein F(t) is the time dependent frequency of the oscillator and $f_o$ is the nominal frequency, t is time and ca is the y-intercept. Integrating the above with respect to time over the interval $t_0$ to T−$t_0$, wherein T−$t_0$ equals the duration of the second time period, results in the equation:

$$\frac{ADR \cdot t^2}{2} + ca \cdot t.$$

However, it can be assumed that ca=0 because there is no time error at the initiation of training.

Since AGEDRIFT$_{int}$ is the computed integral of the frequency drift due to crystal aging over the second time period, then $$AGEDRIFT_{int} = \frac{ADR \cdot (T - t_0)^2}{2}, \text{ and}$$

$$ADR = \frac{2 \cdot AGEDRIFT_{int}}{(T - t_0)^2}.$$

Since AGEDRIFT$_{int}$ is in units of nanoseconds·seconds and T is in units of seconds, ADR is in units of nanoseconds/seconds and contains the rate of change of frequency drift due to crystal aging in units of nanoseconds per second. After the ma and ca coefficients and ADR have been computed and stored in a memory, such as an EEPROM, the training status flag is reset to indicate that the temperature model training process and the age model training process have completed and that the auxiliary correction signal module 20 can provide an auxiliary correction signal 44 to the signal selection switch 42 if the GPS signal is lost.

According to one embodiment of the present invention, even after computation of the ma and ca coefficients and ADR, the age module 52 continues to obtain correction signals and corresponding temperatures, continues to generate TMCV values, and periodically updates the age curve coefficients ma and ca and the ADR based on such computations, all as described previously. According to another embodiment of the present invention, the age curve coefficients ma and ca are calculated and updated each reference timing signal interval. According to yet another embodiment of the present invention, memory buffers that are used to store the data used to generate the ma and ca coefficients and ADR are cleared after a period of time, for example 24 hours, and the process as described above with respect to the analysis of correction signals and corresponding temperatures is repeated. However, even during such time period, the auxiliary correction signal module 20 can provide auxiliary correction signals during a holdover period using the most recently computed ma and ca coefficients and ADR.

Figure 5:
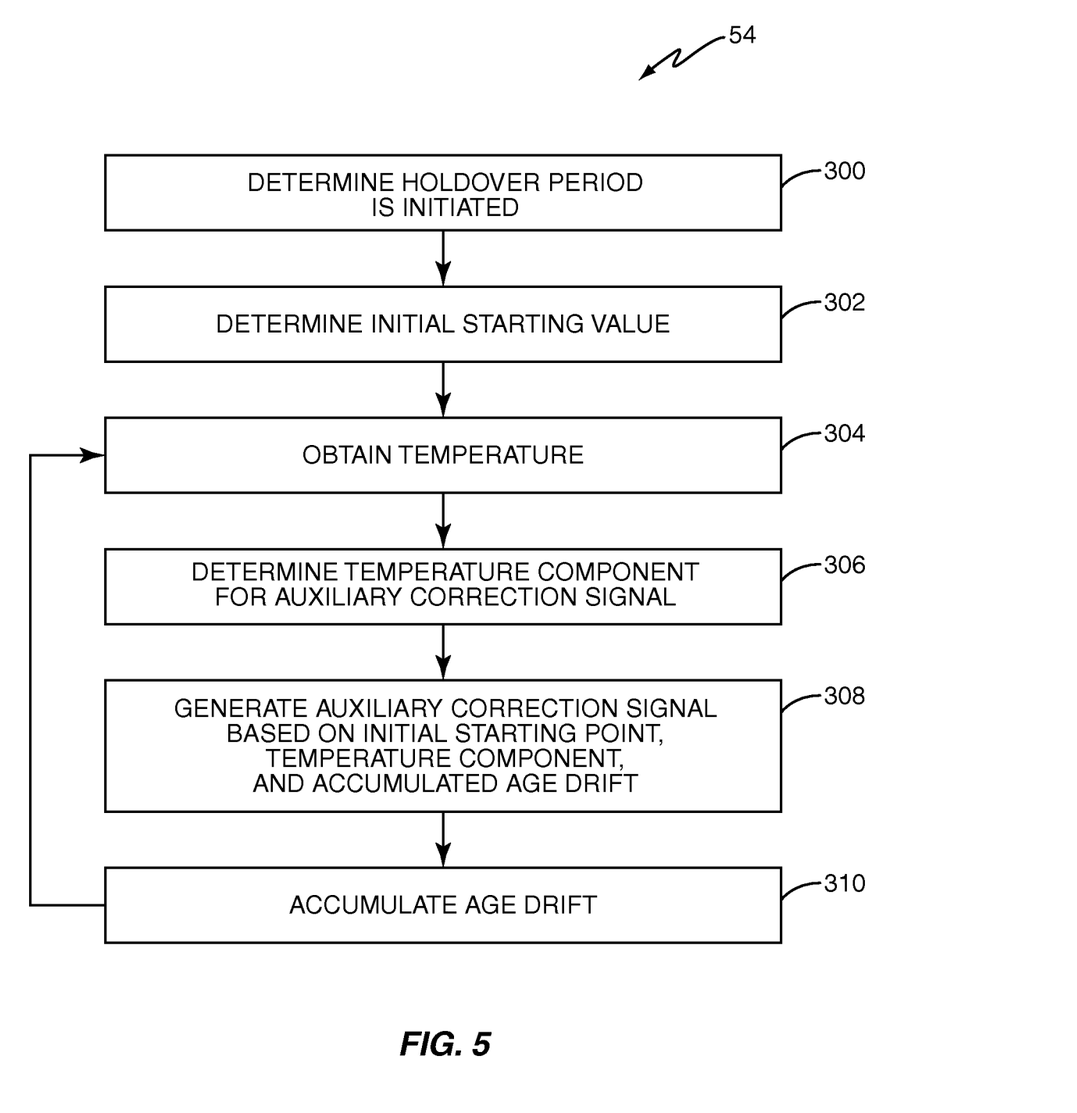
FIG. 5 is a flow diagram illustrating steps associated with the auxiliary correction signal generator shown in FIG. 2, according to one embodiment of the present invention.

Referring now to FIG. 5, an auxiliary correction signal generator 54 according to one embodiment of the invention is shown in greater detail. A determination is made that the GPS lock flag is reset, indicating that the GPS signal has been lost and that a holdover period has begun, and primary correction signals cannot be generated (step 300). An initial starting value (ISV) for an auxiliary correction signal based on the ma and ca coefficients generated by the age module 52 is then generated (step 302) in the following manner:

$$ISV = ma \cdot (\text{last\_GPS\_clock\_value}) + ca,$$

wherein ma and ca are the coefficients previously stored in the EEPROM, and last_GPS_clock_value is the most recent valid GPS clock value prior to loss of the GPS signal. This equation will hereinafter be referred to as the AGE curve. Thus, ISV represents the best estimate of where the next point on the curve of $CS_{res}$ values and GPS clock values would have been had the GPS signal not been lost. This value therefore represents the best initial starting value for the holdover period and is computed only once at the beginning of a holdover period.

A temperature corresponding to the oscillator 14 is obtained from the temperature sensor 18 (step 304). The m and c coefficients of the correction signal temperature curve $CS_{TEMP}$ computed during temperature model training are then obtained from memory, and a temperature component is generated (step 306), in the following manner:

$$\text{temperature component} = m \cdot \text{Temperature} + c.$$

An auxiliary correction signal is generated based on the ISV, temperature component, and the accumulated age drift. The accumulated age drift is the ADR accumulated over the holdover period (step 308). At the beginning of the holdover period, the accumulated age drift is zero. The accumulated age drift is incremented by the ADR (step 310); thus, the accumulated age drift increases by the ADR for each auxiliary correction signal. The auxiliary correction signal generator 54 then returns to step 304 and completes steps 304 to 310 and generates a new auxiliary correction signal 44 for each reference timing signal interval until the GPS signal can be reacquired.

The temperature module 50, the age module 52, and the auxiliary correction signal generator 54 can be implemented in circuitry, such as in an integrated circuit, an Application Specific Integrated Circuit (ASIC), as software programmed to execute on a general or special purpose processor, or in any other manner suitable to implement the functionality described herein.

Those skilled in the art will recognize improvements and modifications to the preferred embodiments of the present invention. While the present invention has been described herein in the context of a base station, it will be apparent to those skilled in the art that the present invention could be used in any application requiring a determination of frequency drift due to age in the presence of other factors. All such improvements and modifications are considered within the scope of the concepts disclosed herein and the claims that follow.

What is claimed is:

1. A method for determining frequency drift of an oscillator, comprising:
obtaining a plurality of residual values during an age drift rate calculation period, wherein each of the plurality of residual values corresponds to a difference between an oscillator output signal and a reference signal, wherein said obtaining the plurality of residual values comprises:
obtaining a first plurality of correction signals and associated first temperatures during a temperature curve calculation period;
determining a correction signal temperature curve that represents an impact of temperature on the oscillator output signal;
obtaining a second plurality of correction signals and associated second temperatures during the age drift rate calculation period;
determining corresponding temperature model corrected values for each of the second plurality of correction signals based on the correction signal temperature curve and the associated second temperatures;
generating the plurality of residual values based on the second plurality of correction signals and the corresponding temperature model corrected values;
integrating the plurality of residual values to generate an integrated aging quantity; and
determining an age drift rate of the oscillator output signal based on the integrated aging quantity.

2. The method of claim 1, wherein determining the age drift rate of the oscillator output signal comprises determining the age drift rate in accordance with the formula:

$$\text{age drift rate} = \frac{2 \cdot IAQ}{(T - t_0)^2}$$

wherein $T - t_0$ represents the age drift rate calculation period and IAQ represents the integrated aging quantity.

3. The method of claim 1, wherein determining the correction signal temperature curve comprises determining an equation that substantially fits the first plurality of correction signals corresponding to the associated first temperatures.

4. The method of claim 1, further comprising:
determining that a holdover period is initiated; and
for each reference timing signal interval:
obtaining a holdover temperature;
determining a temperature component for an auxiliary correction signal based on the correction signal temperature curve and the holdover temperature;
generating the auxiliary correction signal based on the temperature component and the age drift rate.

5. The method of claim 4, further comprising accumulating the age drift rate for each reference timing signal interval after an initial reference timing signal interval to determine an accumulated age drift rate, wherein the auxiliary correction signal is generated based on the accumulated age drift rate.

6. The method of claim 4, further comprising generating an initial starting value, wherein the auxiliary correction signal is further based on the initial starting value.

7. The method of claim 6, further comprising:
determining an aging curve based on the plurality of residual values obtained during the age drift rate calculation period; and
determining the initial starting value based on the aging curve.

8. The method of claim 7, wherein determining the aging curve further comprises determining an equation that defines a substantially best fit of the plurality of residual values and corresponding Global Positioning System (GPS) clock values.

9. The method of claim 1, further comprising:
determining that a holdover period is initiated; and
for each reference timing signal interval:
obtaining a holdover temperature;
determining a temperature component for an auxiliary correction signal based a correction signal temperature curve that represents an impact of temperature on the oscillator output signal; and
generating the auxiliary correction signal based on the temperature component and the age drift rate.

10. An apparatus for determining frequency drift of an oscillator, comprising:
an oscillator adapted to provide an oscillator output signal; and
circuitry associated with the oscillator and adapted to:
obtain a plurality of residual values during an age drift rate calculation period, wherein each of the plurality of residual values corresponds to a difference between an oscillator output signal and a reference signal, wherein obtaining the plurality of residual values comprises:
obtaining a first plurality of correction signals and associated first temperatures during a temperature curve calculation period;
determining a correction signal temperature curve that represents an impact of temperature on the oscillator output signal;
obtaining a second plurality of correction signals and associated second temperatures during the age drift rate calculation period;
determining corresponding temperature model corrected values for each of the second plurality of correction signals based on the correction signal temperature curve and the associated second temperatures; and
generating the plurality of residual values based on the second plurality of correction signals and the corresponding temperature model corrected values;
integrate the plurality of residual values to generate an integrated aging quantity; and
determine an age drift rate of the oscillator output signal based on the integrated aging quantity.

11. The apparatus of claim 10, wherein the age drift rate is determined in accordance with the formula:

$$\text{age drift rate} = \frac{2 \cdot IAQ}{(T - t_0)^2},$$

wherein $T-t_0$ represents the age drift rate calculation period and IAQ represents the integrated aging quantity.

12. The apparatus of claim 10, wherein the correction signal temperature curve comprises an equation that substantially fits the first plurality of correction signals corresponding to the associated first temperatures.

13. The apparatus of claim 10, wherein the circuitry is further adapted to:
determine that a holdover period is initiated; and
for each reference timing signal interval:
obtain a holdover temperature;
determine a temperature component for an auxiliary correction signal based on the correction signal temperature curve and the holdover temperature; and
generate the auxiliary correction signal based on the temperature component and the age drift rate.

14. The apparatus of claim 13, wherein the circuitry is further adapted to accumulate the age drift rate for each reference timing signal interval after an initial reference timing signal interval to determine an accumulated age drift rate, wherein the auxiliary correction signal is generated based on the accumulated age drift rate.

15. The apparatus of claim 13, wherein the circuitry is further adapted to generate an initial starting value, wherein the auxiliary correction signal is further based on the initial starting value.

16. The apparatus of claim 15, wherein the circuitry is further adapted to:
determine an aging curve based on the plurality of residual values obtained during the age drift rate calculation period; and
determine the initial starting value based on the aging curve.

17. The apparatus of claim 16, wherein the aging curve comprises an equation that substantially fits the plurality of residual values and corresponding Global Positioning System (GPS) clock values.

18. The apparatus of claim 10, wherein the circuitry is further adapted to:
determine that a holdover period is initiated; and
for each reference timing signal interval:
obtain a holdover temperature;
determine a temperature component for an auxiliary correction signal based on a correction signal temperature curve that represents an impact of temperature on the oscillator output signal; and
generate the auxiliary correction signal based on the temperature component and the age drift rate.

* * * * *